United States Patent [19]
Berlekamp

[11] 4,410,989
[45] Oct. 18, 1983

[54] BIT SERIAL ENCODER

[75] Inventor: Elwyn R. Berlekamp, Berkeley, Calif.

[73] Assignee: Cyclotomics, Inc., Berkeley, Calif.

[21] Appl. No.: 215,361

[22] Filed: Dec. 11, 1980

[51] Int. Cl.³ .............................................. G06F 11/10
[52] U.S. Cl. .......................................... 371/40; 371/37
[58] Field of Search ........................ 371/40, 37, 39, 45

[56] References Cited

U.S. PATENT DOCUMENTS

| | | | |
|---|---|---|---|
| 3,278,729 | 10/1966 | Chien | 371/40 |
| 3,487,361 | 12/1969 | Frey, Jr. | 371/40 |
| 3,988,677 | 10/1976 | Fletcher et al. | 371/40 |

OTHER PUBLICATIONS

Mandelbaum, Some Classes of Multiple-Burst Error-Correcting Codes Using Threshold Decoding, IEEE Trans. on Info. Theory, Mar. 1972, pp. 285-291.
Peterson & Weldon, Error Correcting Codes, 2nd Edition, The MIT Press, 1972, pp. 42-47.
Massey, "Reversible Codes", Information and Control, vol. 7, pp. 369-370 (1964).

*Primary Examiner*—Charles E. Atkinson
*Attorney, Agent, or Firm*—E. H. Berkowitz

[57] ABSTRACT

An encoder for Reed Solomon codes employs structure for producing interleaved code wherein redundancy bits are realized by a bit serial multiplicative procedure. Operations are accomplished with respect to the dual basis to the conventional polynomial representational basis as coefficients of successive powers of an element of a finite field. Code bits are generated and interleaved by a feedback shift register constructed from standard RAM chips. The structure is simplified by selection of a generator polynomial from a class which exhibits symmetry whereby the number of independent coefficients for representing the generator polynomial is halved.

17 Claims, 8 Drawing Figures

BIT SERIAL ENCODER

The Government has rights in this invention pursuant to contract No. NAS5-25630 awarded by the National Aeronautics and Space Administration.

FIELD OF THE INVENTION

The invention is in the field of encoding apparatus for digital data transmission for storage.

BACKGROUND OF THE INVENTION

The encoding of digital data in cyclic codes enables the recovery, through error correction techniques, of data which has been degraded by noise in the transmission between the data source and its destination or in the process of storing or retrieving data. Encoding is accomplished by appending to a set of n data bits, a further set of r check bits to form a message block. The r check bits are derived from the n data bits, in accord with an encoding rule. At the data source it is the function of an encoder to derive the r check bits from the n data bits and assemble the message block and the check bits into a code block for transmission or storage in the signal channel. At the destination terminal, decoding apparatus processes the message block to detect the presence of error(s) and to act, in the alternative, to present the n data bits for further processing or in the absence of error, to take corrective action where error has been detected. The decoding apparatus is outside the scope of the present invention, but it will be understood that an appreciation of decoding apparatus, specifications, requirements, and limitations is an important consideration in the design of encoding apparatus.

A sequence of information characters forming a message character, $C(x)$, are interpreted as coefficients of an n bit binary polynomial $$C(x) = \sum_{i=0}^{n-1} C_i x^i$$

and each of the coefficients $C_i$ are elements defined on a finite field. It is an elementary function of an encoder to derive check bits by subjecting the message character to multiplication or division by a generator polynomial, $G(x)$. The generator $G(x)$ is chosen to impart selected properties of the code to a block of message characters treated together.

In one conventional representation of message data expressed as a sequence of binary bits, the least significant bit is interpreted as the coefficient of $\alpha^0$, the next most significant bit is interpreted as the coefficient of $\alpha^1$, the next most significant bit as the coefficient of $\alpha^2$ and so on where $\alpha$ is an element of a finite field. For want of a more concise nomenclature, this representation will be called a "conventional basis".

Frequent reference will be made in this document to the "dual basis". For the purposes of this work, the term "dual basis" will be understood to refer to the representational basis which is dual to that representational basis wherein binary digits of a message signal are interpreted as the coefficients of successive powers of an element of a finite field.

The relationship of polynomials which are dual to one another is considered in mathematical literature, for example in Berlekamp, *Algebraic Coding Theory*, McGraw Hill, 1968 See also MacWilliams and Sloan, *The Theory of Error Correcting Codes*, North-Holland Publishing Company, Amsterdam, 1977; Lempel, *Matrix Factorization Over GF(2) and Trace-Orthogonal Bases of $GF(2)^n$*, SIAM J. Compute., V.4, 1975, pps. 175-186. The application of a dual representation has not previously been recognized as a useful alternate basis for encoder structure.

An RS encoder produces a codeword by performing the multiplication of a message polynomial by a generator polynomial where all operations are defined over a finite field. The multiplication can be performed by concurrent operation on the message bits, in which case it can be appreciated that such parallel operations will be implemented in apparatus large enough to include subcomponents sufficient to implement all the respective suboperations at the same time. In contrast, serial apparatus develops the desired product over successive time-displaced steps. Similar operations may therefore be implemented in the same subsystems of the apparatus at successive times. Exploitation of this observation permits the time sharing of such subsystems leading to a simplified encoder. In a bit serial encoder, one coefficient of the product polynomial is computed in each unit of time.

It is knwon in the prior art to construct encoders to treat successive message characters within a message block as subcoders for the separate computation of redundancy bits. In the absence of such an interleaving process the message word would be somewhat more vulnerable to burst errors. Thus it is desirable to distribute the redundancy bits within the encoded message word by an interleaving process.

Prior art encoders have generally been designed with an emphasis on the rate at which information is encoded. Other factors, however, must be considered where it is important to minimize the weight, power requirements, heat dissipation and cost for the encoding apparatus. Clearly these considerations are paramount for information channels operating from spacecraft, as for example communication satellites and the like.

BRIEF SUMMARY OF THE INVENTION

The present invention derives redundancy bits from serial multiplication of message character bits by a generator polynomial which preferably exhibits specified symmetry properties. The apparatus which implements the method develops an effective product, bit by bit, in serial fashion and interleaves the redundancy bits derived from the corresponding message words of interleaved subsets of messages. The resulting encoded information may subsequently be transmitted or stored. Thereafter, the data is subject to a decoding process wherein errors may be detected and corrected in the course of transmission, reception, storage, or retrieval from storage. These subsequent operations are outside the scope of the present invention which relates to the method and apparatus for encoding.

In the present invention the product coefficients resulting from the multiplication of a polynomial variable by a polynomial constant are generated in such a fashion that each bit of the product is derived sequentially through a single conductor from the same set of gates applied to the same physical register, as embodied in a simple implementation.

It is conventional to represent elements of a field $GF(2^m)$, as described above, in a "conventional basis", which may also be called an "alpha basis". If a variable Y represented as $$Y = \Sigma Y_i \alpha^i \quad (1)$$

having bits $Y_0, Y_1, \ldots, Y_{m-1}$ is multiplied with another m bit entity of the field, for example, a generator polynomial $$G = \Sigma G_i \alpha^i \quad (2)$$

the coefficient of the product P can be computed in a straightforward fashion in the same representation, $$P = \Sigma P_i \alpha^i.$$

In the context of a bit parallel encoder over $GF(2^m)$ the m bits of $G_1$ are typically wired constants and the m bits $Y_i$ of the message symbol are concurrently available for simultaneous computation of the product coefficients. It is clear in that case that m computational circuits will be required. In a bit serial encoder according to the present invention, a single equivalent computational circuit will develop the desired product over an interval of m separate time periods.

Mathematically, a bit serial encoder performs m-1 successive linear transformations on an m bit message character, operating upon the transformed variable at each successive transformation to obtain the m bit product coefficients sequentially.

In order to implement the serialized multiplication a variable Z is expressed in another basis $$Z = \Sigma Z_i \beta_i, \; i = 0, 1, \ldots, m-1. \quad (3)$$

The $\beta_i$ are linearly independent elements of the field $GF(2^m)$. The coefficients of Z in the $\beta$ basis will be given by $$Z_i = Tr(Z \cdot \alpha^i). \quad (4)$$

If the $\beta_i$ are solutions of $$Z_j = Tr\left(\alpha^j \left(\sum_i Z_i \beta_i\right)\right)$$

$$= \sum_i Z_i (Tr(\alpha^j \beta_i))$$

this will be recognized as stating an orthogonality condition between the $\alpha$ basis and the $\beta$ basis.

$$Tr(\alpha^j \beta_i) = 1, \; i = j \quad (5)$$
$$= 0, \; i \neq j$$

Where a polynomial coefficient $G_{(k)}$ multiplies a variable Z, the coefficients of the product $ZG_{(k)}$ are given by the m bits $$Tr(G_{(k)}(Z\alpha^i)), \; i = 0, 1, \ldots, m-1. \quad (6)$$

The inner parenthesized quantity can be realized in an appropriate shift register wherein the quantity $Z\alpha^{i+1}$ is obtained from $Z\alpha^i$ by clocking the shift register containing Z and supplying to the most significant bit of Z, at the mth clocking, the quantity $Tr(\alpha^m Z)$. At each clocking a parity tree interrogates the Z register to form for each of the coefficients of G, the m bits of the coefficient of the product. Each of the quantities expressed by the expression (6) above are recognized as a single parity check upon an appropriately selected subset of bits of Z and are obtained by operation of a gating structure on the corresponding bits of the Z register. These product coefficient bits are then directed from the output of the parity tree to a corresponding summing junction of a feedback shift register where the product bits are further ordered and assembled. The Z register is clocked m−1 times and at each clocking the process repeats, successively obtaining the quantities of expression (6).

When the bits of the final product coefficient $Tr(GZ\alpha^{m-1})$ have been obtained, a new message character is loaded into Z and the process repeats. The main feedback shift register continues to order, assemble and operate upon the one-bit functions belonging to a common parent code and check characters are emitted from the main feedback shift register for appending to the original block of message characters.

A result of the present work is the recognition that the most simple realization of the scheme described is obtained when the internal operations of the encoder are implemented in the dual basis and the form of the parity tree, the selection of subsets of bits of the Z register and the transformations thereof reflect this internal representational basis which is dual to the conventional basis that consists of $1, \alpha, \alpha^2, \ldots, \alpha^{m-1}$.

It is an object of the present invention to realize an encoder distinguished by economy of construction, minimal weight and power requirements and reduced heat dissipation.

In one feature of the present invention redundancy bits are developed in bit-serial fashion by a multiplicative procedure.

In another feature of the invention, the operations for developing redundancy bits is accomplished in a structure which realizes a representation in the dual basis to the representation of the message data as ascending powers of a polynomial.

Still another feature of the invention is a feedback shift register for developing redundancy bits by bit serial multiplication and implementing an interleaved structure for the message block.

In still yet another feature of the invention, the generator polynomial is selected from a class of polynomials for which the coefficients of said polynomial are invariant with respect to a reversal of the order of said coefficients, whereby the number of coefficients for defining the generator polynomial is reduced by substantially half.

In again another feature of the invention a feedback shift register is implemented from at least two separately addressed random access memory (RAM) arrays wherein a plurality of component shift registers is realized in each RAM, and adjacent component shift registers are realized in corresponding RAM arrays.

In still another feature of the present invention a feedback shift register having at least four component shift registers and first interstage summing means disposed between first and second component shift registers. second summing means disposed between second and third component shift registers and third summing means disposed between third and fourth component shift registers, at least first and third said component shift registers implemented in a common RAM, the same addend applied to said first and third summing means, said first and third summing means realized in a single summing means.

These and other objects and advantages of the present invention will become apparent upon perusal of the detailed description of a preferred embodiment for which frequent reference is made to the several figures of the drawings.

DETAILED DESCRIPTION OF THE INVENTION

Figure 1:
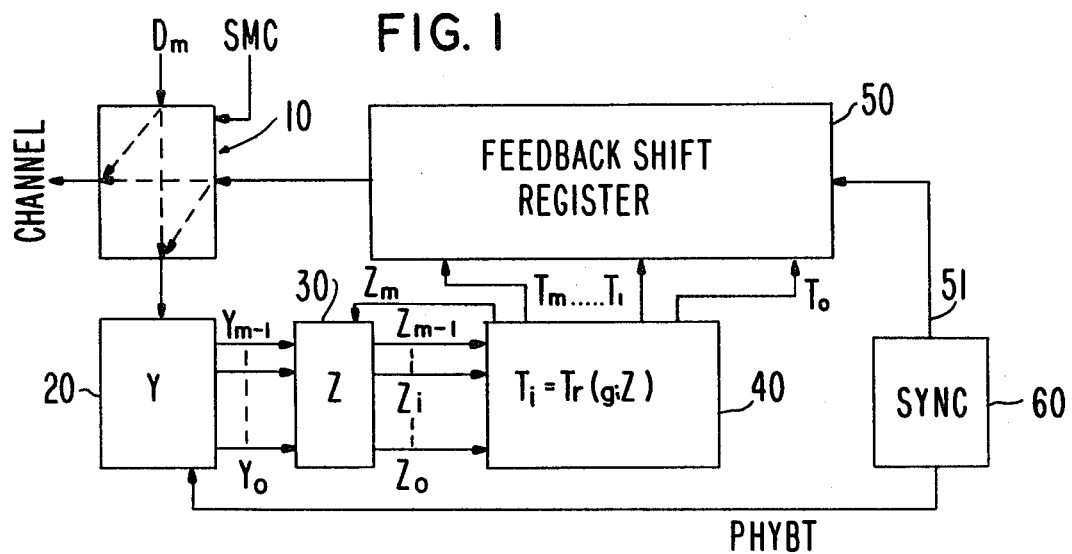
FIG. 1 is a schematic representation of a preferred embodiment of the invention.

An overview of the structure of the present invention is shown in FIG. 1. An input data stream is admitted to a multiplexor 10. The operational mode of the apparatus is controlled from an external toggle called SMC which switches the encoder operating mode between message mode and check mode. The SMC signal controls the data paths of the multiplexor 10. In the message mode, the input data stream is split, one branch directed to the output channel, the other branch concurrently presenting the input data stream to the encoder proper to form a character in the Y register 20. Upon assembly of a message character in Y register 20, the character $y_1 y_2 \ldots y_n$ transfers in parallel to Z register 30. The several bits of Z are summed in various combinations in accord with algebraic manipulation implemented by a matrix network 40 and described below. These operations are defined and carried out internally in the so-called "dual basis." Quantities so derived are directed to the summing junctions of feedback shift register 50 where portions of the message data bits are developed which exhibit the desired error correcting properties when appended to the original data stream issuing from the channel output. The feedback shift register is filled in an interleaved fashion with check bits forming the check symbols of corresponding interleaved message symbols of the channel input.

At the conclusion of a block of message symbols the external signal SMC toggles the encoder to its check mode operation and the emission of redundancy bits to the channel is initiated. This follows immediately after the emission of the last message bit to the channel.

Synchronization logic block 60 provides a number of synchronous functions required to control the several register transfers of the apparatus. Control signals 51 synchronize and direct the propagation of data in feedback shift register 50. The signal named PHYBT controls the Y→Z transfer.

In order to better represent the salient aspects of the present invention, the apparatus in FIG. 1 will be discussed in the context of a particularly simple encoder for implementing the RS [7,3] code over $GF(2^3)$ interleaved up to depth 2. Each block has $7 \times 3 \times 2$ message bits and $3 \times 3 \times 2$ check bits. In accord with the preferred embodiment of the invention, the model encoder is designed to employ a symmetric generator polynomial and to generate check symbols by a bit serial multiplicative process carried out in an internal basis which is the dual of the conventional basis for representation of a message symbol as a set of binary coefficients of powers of an element of a finite field. The explanation of these attributes requires a brief digression.

The model encoder which is the vehicle for the exposition of the invention is defined to encode over $GF(2^3)$. The code will have 8 symbols, which for convenience are denoted by 0, 1, $\alpha^1$, $\alpha^2$, $\alpha^3$, $\alpha^4$, $\alpha^5$ and $\alpha^6$, where $\alpha$ is a primitive element of the field. In the present example, $\alpha$ is selected to satisfy $$\alpha^3 + \alpha + 1 = 0.$$

The set of symbols includes 0, unity (hereafter $\alpha^0$) and six further symbols which have representations as binary linear combinations of the coefficients of the powers of $\alpha^0$, $\alpha^1$, and $\alpha^2$. The coefficients of these three binary digits represent the 8 symbols as shown in Table I.

TABLE I

| Power of $\alpha$ | $\alpha$ basis $\alpha^2 \alpha^1 \alpha^0$ | $Tr(\alpha^i)$ | $\gamma$ basis $\gamma_1 \gamma_2 \gamma_3$ |
|---|---|---|---|
| 0 | 000 | 0 | 000 |
| $\alpha^0$ | 001 | 1 | 111 |
| $\alpha^1$ | 010 | 0 | 001 |
| $\alpha^2$ | 100 | 0 | 010 |
| $\alpha^3$ | 011 | 1 | 110 |
| $\alpha^4$ | 110 | 0 | 011 |
| $\alpha^5$ | 111 | 1 | 100 |
| $\alpha^6$ | 101 | 1 | 101 |

It is desired to define the generator polynomial for the model example to exhibit the desired symmetry properties and further to yield a nontrivial code having at least double error correcting capability. The choice of a generator polynomial follows from a number of technical specifications of the desired error correcting properties. It is known in the prior art that a generator polynomial for a given designed distance d of a code may be chosen as $$g(x) = \prod_{i=0}^{d-2} (x - \alpha^i).$$

The choice is not unique, however. The expression may be generalized to $$g(x) = \prod_{i=l}^{d+l-2} (x - \alpha^i).$$

The error correcting properties of Reed-Solomon codes are independent of the choice of l in the above expression. Nevertheless, the present work exploits unique values for l for which the generator polynomial exhibits the property that the distribution of coefficients is symmetrical. Such a polynomial is more precisely and succinctly described as a palindrome.

The choice of l to establish this symmetry property depends upon the odd or even property of the parameter d. For d odd it can be shown that $$l = 2^{m-1} - (d-1)/2$$

where m, an integer greater than 1, specifies the order of $GF(2^m)$.

For d even $$l = -(d-2)/2$$

are values of l which yield a symmetric generator polynomial. The symmetry of the generator polynomial has the effect of halving the number of coefficients required to specify the generator polynomial in the present invention. This property is exploited to reduce the number of distinct coefficients and their corresponding algebraic manipulative components and to produce concurrent inputs to the feedback shift register 50 from which the codeword is derived.

In accord with the above, the choice $d=5$ yields $l=2$ and the roots of the symmetrical generator polynomial are $\alpha^2$, $\alpha^3$, $\alpha^4$ and $\alpha^5$. There results the generator $$G(z) = (Z + \alpha^2)(Z + \alpha^3)(Z + \alpha^4)(Z + \alpha^5)$$
$$= G_0 Z^4 + G_1 Z^3 + G_2 Z^2 + G_1 Z^1 + G_4.$$

The coefficients $G_i$ are obtained by carrying out the expansion for G(z) and collecting terms with like powers of Z. From Table I there results:

$$G_0 = 1 = \alpha^0$$
$$G_1 = \alpha^2 \oplus \alpha^3 \oplus \alpha^4 \oplus \alpha^5 = \alpha^4$$
$$G_2 = \alpha^1 \oplus \alpha^2 \oplus \alpha^5 \oplus \alpha^6 = \alpha^2$$
$$G_3 = \alpha^5 \oplus \alpha^2 = \alpha^4$$
$$G_4 = 1 = \alpha^0$$

Thus, the generator coefficients form the symmetric set or palindrome $\alpha^0$, $\alpha^4$, $\alpha^2$, $\alpha^4$ $\alpha^0$.

A valid codeword will be a multiple of the generator polynomial. Given a message word of symbols $M_1$, $M_2$ and $M_3$, the encoder computes check symbols $R_0$, $R_1$, $R_2$ and $R_3$ to yield the codeword $$Z^6 M_1 + Z^5 M_2 + Z^4 M_3 + Z^3 R_3 + Z^2 R_2 + Z^1 R_1 + R_0.$$

The message symbols $M_i$ and check symbols $R_i$ are each three bits in length according to the definitions. If the three bits of each $M_i$ are available concurrently, a bit parallel encoder may be conceptualized as in FIG. 2A. Each line of this figure transmits 3 bits in parallel. This encoder may be considered as operating in message mode in response to an input control signal, $SMC=1$, where the input, $D_{in}$, is connected to the input data stream, through switch 70, and the internal register switch 71 is connected to the adder 72 which forms the feedback $R_3 \oplus M_i$ where $M_i$ is a message symbol. When the last message symbol has been accepted, switch 71 is toggled to produce zeroes and the channel switch 70 is connected to receive the output from the first stage of the encoder.

TABLE IIA

| t | SMC | M | $R_3 + M$ | $R_0$ | $R_1$ | $R_2$ | $R_3$ | Output |
|---|---|---|---|---|---|---|---|---|
| 0 | 1 | 1 | 1 | 0 | 0 | 0 | 0 | 1 |
| 1 | 1 | $\alpha^5$ | 1 | 1 | $\alpha^4$ | $\alpha^2$ | $\alpha^4$ | $\alpha^5$ |
| 2 | 1 | $\alpha$ | 0 | 1 | $\alpha^5$ | $\alpha$ | $\alpha$ | $\alpha$ |
| 3 | 0 | — | — | 0 | 1 | $\alpha^5$ | $\alpha$ | $\alpha$ |
| 4 | 0 | — | — | 0 | 0 | 1 | $\alpha^5$ | $\alpha^5$ |
| 5 | 0 | — | — | 0 | 0 | 0 | 1 | 1 |
| 6 | 0 | — | — | 0 | 0 | 0 | 0 | 0 |

Figure 2A:
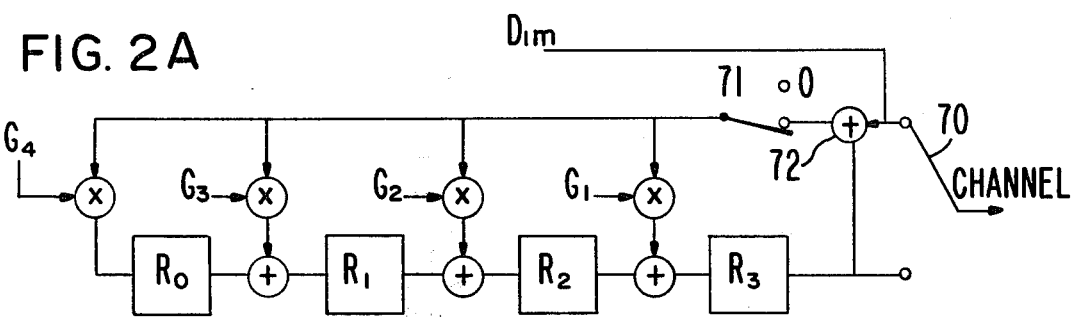
FIG. 2A is a simplified illustration of a bit parallel encoder of the prior art.

The operation of the encoder of FIG. 2A is summarized with the aid of Table IIA which exhibits the condition of the several quantities of interest as a function of time. A test message block comprises the (noninterleaved) message symbols $M_1$, $M_2$ and $M_3$ which appear at the input as the successive symbols $\alpha^0$, $\alpha^5$ and $\alpha^1$ during which time $SMC=1$. The message symbols are also presented in succession to the channel. The signal SMC then toggles to 0 and thereafter only 0s enter the feedback shift register. It will be seen that the check symbols $\alpha^1$, $\alpha^5$, $\alpha^0$ and 0 are then emitted in succession to the channel to complete the codeword.

The symmetry property of the generator polynomial has not been exploited in the conceptualized encoder of FIG. 2A. It should be noted at this point that the near symmetry of the output codeword of this example is accidental and not a result of any particular interest in the present invention.

TABLE IIB

| t | t' | $M + R_3$ | $R_0$ | $R_1$ | $R_2$ | $R_3$ | Output |
|---|---|---|---|---|---|---|---|
| 0 | 0 | 111 | 000 | 000 | 000 | 000 | 111 |
| 1 | 24 | 111 | 111 | 011 | 010 | 011 | 100 |
| 2 | 48 | 000 | 111 | 100 | 001 | 001 | 001 |
| 3 | 72 | — | 000 | 111 | 100 | 001 | 001 |
| 4 | 96 | — | 000 | 000 | 111 | 100 | 100 |
| 5 | 120 | — | 000 | 000 | 000 | 111 | 111 |
| 6 | 144 | — | 000 | 000 | 000 | 000 | 000 |

Figure 2B:
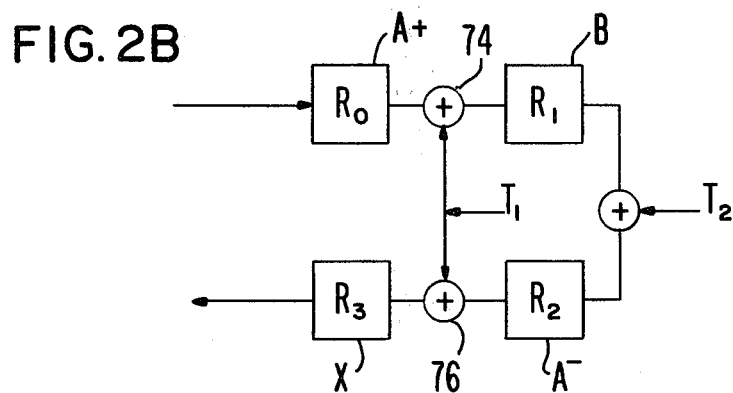
FIG. 2B is a simplified illustration of a model symmeterized feedback shift register of the present invention.

Consider the structure of FIG. 2B, which is not at this point an encoder, but simply an abstract feedback shift register structure. Because of the symmetry of the coefficients G(z), which implies the particular coefficient identity $G_1 = G_3$, the same input may be directed both to the adder 74 disposed between $R_0$ and $R_1$ and to the adder 76 located between $R_2$ and $R_3$. In the present work, it has been observed that the implementation of the feedback shift register of the present invention is economically implemented from random access memory (RAM). The feedback shift register is more precisely an organization of ordinary shift registers, forming delay lines, with summing junctions between component delay lines (shift registers). Because RAM is available in large sizes compared to the requirements of the subject component shift registers, it is possible to implement several component shift registers within a common RAM array. An example to be described in detail below is evident in FIG. 2B wherein the elements $R_0$ and $R_2$ can be configured to occupy the same RAM array which will be denoted RAM A. For this reason the shift register stage $R_2$ is renamed $A^-$ and the stage $R_0$ is referenced as $A^+$ to indicate their respective residence within RAM array A. In similar fashion the respective stages $R_1$ and $R_3$ will be denoted by B and X respectively. While it would appear that elements B and X might enjoy a similar relationship to one another, permitting residence in a common RAM array, there are certain system requirements, described below, which prevent that arrangement. Therefore elements B and X reside in separate RAMs.

Figure 2C:
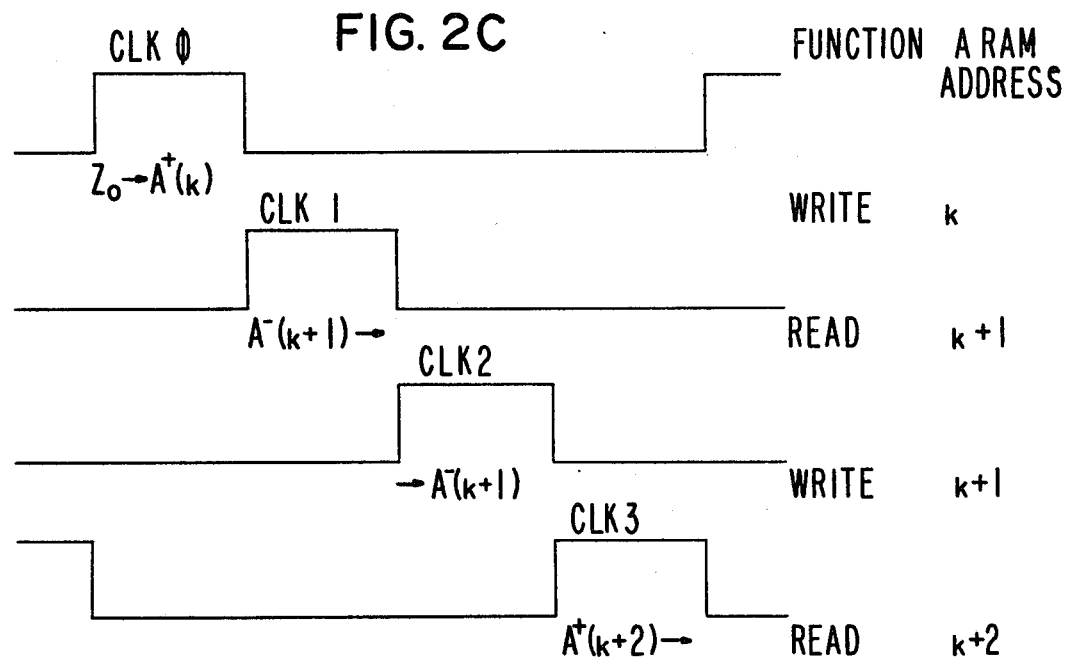
FIG. 2C is a timing diagram for part of the apparatus of FIG. 2B.

The sharing of stages $A^+$ and $A^-$ within the same RAM array or chip is accomplished by time sharing the RAM chip between its identities, here $A^+$ and $A^-$. In the most obvious implementation $A^+$ and $A^-$ elements occupy successive adjacent addresses of RAM A. In operation a four phase clock controls the synchronization of the respective RAM arrays of the feedback shift register and in particular RAM A can be seen to support the pair of component shift registers $A^+$, $A^-$ because only one such shift register is active during any clock phase, although RAM A will be executing either a read or write at each clock phase. FIG. 2C illustrates the time sharing where during clock phase 0 a bit is strobed into RAM A at an address within the sub array A+. At clock phase 1 the content of an appropriate address within sub array A− is retrieved and read out for processing (an XOR operation and transfer to an adjacent component shift register). During clock phase 2 a new bit is written into sub array A−. Finally, at clock phase 3 a bit is read into sub array A+. A particular input bit can be regarded as consuming four clock cycles comprising a four phase clock.

It is noted that the summing junctions comprising adders 74 and 76 are located at the output of the same RAM A and receive the same coefficient dependent signal due to the symmetry of the coefficients. It is clear that these adders are in fact the same adder which also takes on alternate identities corresponding to synchronized clock phases. Accordingly, a four stage feedback shift register with three interstage summing junctions can be implemented with the hardware of three (instead of four) such stages and two (instead of three) interstage adders. In encoders for codes with higher redundancies the savings in such components approaches a factor of two.

The sub arrays A+ and A− may be regarded as addressed by a common addressing means. It is clear that A+ addressing will change between phases 0 and 1 and again between phases 2 and 3. The adjacent RAMs B and X together require address transitions between phases 1 and 2 and again between phases 3 and 0. This timing is illustrated in FIG. 2C.

The encoder of FIG. 2A has been described as a bit parallel encoder. In order to implement bit-serial product development, resort must be had to operations in the dual basis to the $\alpha$ basis because only this basis allows each bit of the product to be obtained sequentially on a single wire from the same set of gates applied to the same shift register as embodied in a particularly simple implementation.

Just as the $\alpha$ basis is defined in terms of three basis vectors, $\alpha^0$, $\alpha^1$ and $\alpha^2$, a basis dual to the $\alpha$ basis is defined in terms of three basis vectors $\gamma_1$, $\gamma_2$ and $\gamma_3$. An appropriate such dual basis exhibiting the necessary orthogonality must be selected and the transformation between the $\alpha$ basis and the $\gamma$ basis defined. The condition of orthogonality for the $\gamma_i$ requires $$Tr(\beta^{j-1}\gamma_i) = 1, i = j$$
$$= 0, i \neq j$$

The choice of a particular $\alpha$ basis follows from the independent choices of an irreducible polynomial of the field and the choice of primitive elements from which the generator polynomial is subsequently constructed. For a discussion of criteria for these choices in relation to error correcting properties of resulting codes, the reader is urged to consult a standard reference as for example Berlekamp, *Algebraic Coding Theory*, McGraw Hill, 1968. The number of different bases is given by a formula involving the Moebius function. See Chapter 3, *Algebraic Coding Theory* for a discussion of this material.

For GF($2^8$) the number of irreducible polynomials is 30 and the number of primitive elements is 16. The resulting 480 possible $\alpha$ bases each have a unique dual basis. The complexity of the matrix multiplier, or parity tree for operating on the variable Z to obtain the traces expressed by the $T_i$ can be optimized in respect to a minimization of the number of gates required. For practical encoders of even modest length, this design consideration can lead to a non-trivial reduction in chip count and power reduction.

In the case of the model discussed herein the limited number of choices makes the optimization straightforward. With the choice $\beta = \alpha^3$, $\gamma_1 = \alpha^5$, $\gamma_2 = \alpha^2$, $\gamma_3 = \alpha^1$, the matrix $(\beta^{j-1}\gamma_i)$ can be shown as $$\begin{bmatrix} \alpha^5 & \alpha^2 & \alpha \\ \alpha^2 & \alpha^5 & \alpha^4 \\ \alpha & \alpha^4 & 1 \end{bmatrix}$$

With the aid of Table I, one can readily verify the orthogonality conditions stated above.

In the dual basis, the coefficients of the product of a single generator polynomial coefficient, say $G_k$ and the message symbol Z will be given by the bits $$Z \cdot G_k = a_k\gamma_1 + b_k\gamma_2 + c_k\gamma_3$$

and the successive coefficients of this product are obtained from $$Tr(G_k Z\beta^i), i = 0, 1, \ldots, m-1.$$

For the present example, where $m = 3$, one obtains $$a_k = Tr(G_k Z) = \Sigma z_i Tr(\gamma_i G_k)$$

$$b_k = Tr(G_k(Z\beta)) = \Sigma z_i Tr(\gamma_i \beta G_k)$$

$$c_k = Tr(G_k(Z\beta^2)) = \Sigma z_i Tr(\gamma_i \beta^2 G_k)$$

The quantity Z is a varible residing in the Z register. The quantity $Z\beta$ is obtained from Z (and $Z\beta^2$ from $Z\beta$) by a shift operation on the Z register since $\beta$ is an element of the field. The quantity G is a coefficient of the generator polynomial and thus a constant. The traces required for the re-representation or transformation to the dual basis are obtainable through an XOR gate network between a wired constant ($G_i$) and the Z register quantity. The number of wired constants $G_i$ is substantially reduced when, as in the present instance, a symmetrical constraint is imposed on the coefficients $G_i$. In the present example, $G_1 = G_3$ and a single multiplication between a single wired constant and the Z register will suffice to obtain the required partial product generated by this coefficient(s). Both $G_0$ and $G_4$ are unity and require no multiplication, adding to the simplicity of the model encoder. The coefficient $G_2$ therefore represents the only other multiplier element required for obtaining the remaining non-trivial distinct partial products.

The trace equations for the coefficients of the product of the message character Z with the generator G can be shown with the aid of Table I to yield

| | | |
|---|---|---|
| $a_1 = z_1 + z_2$ | $b_1 = z_0 + z_2$ | $c_1 = z_0 + z_2$ |
| $a_2 = z_0 + z_2$ | $b_2 = z_1 + z_2$ | $c_2 = z_0 + z_2$ |
| $a_3 = a_1$ | $b_3 = b_1$ | $c_3 = c_1$ | where $z_i$ are the bits of Z. The gating structure assumes a particularly simple form because it is only necessary to sum the quantities $z_1 + z_2 = T_1$ and $z_0 + z_2 = T_2$. Because of the reversibility of the generator polynomial, $T_3 = T_1$.

The same operations of Table IIA are re-expressed in the dual basis and appear in Table IIB.

As a consequence of these considerations, the general encoder of FIG. 1 may be described for the model case incorporating the feedback shift register of FIG. 2B. The operation of this encoder with interleaving is recorded in detail in Table III for the same example message symbols $\alpha^0$, $\alpha^5$, $\alpha^1$, now interleaved with a second set of message characters 0, 0 and 0, to constitute the input data block $d_{in}$. Bearing in mind that each input bit requires four cycles, the input data stream can be observed in the column $d_{in}$ and "output" during the prevalence of the condition SMC=1. (N.B. The message symbols are here shown in the encoder dual basis representation merely for convenience.) The transmission of this message block consumes 96 ticks of the master clock and at the conclusion of this interval the transition to the condition SMC=0 occurs and the first check bit is presented to the channel at the 97th tick. Check bits continue to be emitted until the final check bit is presented for transmission at the 168th tick.

TABLE III: $[42, 18]$ $i$ $\iota = 2$ over $GF[2^3]$

| t | Clock cccc llll kkkk 0123 | Counters A | B | X | Control smc | + msg phbyt | d i n | Flipflops YYZZZ 01012 | XB LL | output | ramA even | ramB | ramA odd | ramX |
|---|---|---|---|---|---|---|---|---|---|---|---|---|---|---|
| 00 | 0111 | 4 | 4 | 13 | 1 | 0 | 1 | 00000 | 00 | 1 | 000000 | 000000 | 000000 | 000 |
| . | 1011 | 4 | 5 | 13 | 1 | 0 | 1 | 00000 | 00 | 1 | 000000 | 000000 | 000000 | 000 |
| . | 1101 | 5 | 5 | 13 | 1 | 0 | 1 | 00000 | 00 | 1 | 000000 | 000000 | 000000 | 000 |
| . | 1110 | 5 | 6 | 14 | 1 | 0 | 1 | 00000 | 00 | 1 | 000000 | 000000 | 000000 | 000 |
| 4 | 0111 | 6 | 6 | 14 | 1 | 0 | 1 | 01000 | 00 | 1 | 000000 | 000000 | 000000 | 000 |
| . | 1011 | 6 | 7 | 14 | 1 | 0 | 1 | 01000 | 00 | 1 | 000000 | 000000 | 000000 | 000 |
| . | 1101 | 7 | 7 | 14 | 1 | 0 | 1 | 01000 | 00 | 1 | 000000 | 000000 | 000000 | 000 |
| . | 1110 | 7 | 8 | 15 | 1 | 0 | 1 | 01000 | 00 | 1 | 000000 | 000000 | 000000 | 000 |
| 8 | 0111 | 8 | 8 | 15 | 1 | 1 | 1 | 11000 | 00 | 1 | 000000 | 000000 | 000000 | 000 |
| . | 1011 | 8 | 9 | 15 | 1 | 1 | 1 | 11000 | 00 | 1 | 000000 | 000000 | 000000 | 000 |
| . | 1101 | 9 | 9 | 15 | 1 | 1 | 1 | 11000 | 00 | 1 | 000000 | 000000 | 000000 | 000 |
| . | 1110 | 9 | 10 | 13 | 1 | 1 | 1 | 11000 | 00 | 1 | 000000 | 000000 | 000000 | 000 |
| 12 | 0111 | 10 | 10 | 13 | 1 | 0 | 0 | 11111 | 00 | 0 | 000000 | 000000 | 000000 | 000 |
| . | 1011 | 10 | 11 | 13 | 1 | 0 | 0 | 11111 | 00 | 0 | 000000 | 000000 | 000000 | 000 |
| . | 1101 | 11 | 11 | 13 | 1 | 0 | 0 | 11111 | 00 | 0 | 000100 | 000000 | 000000 | 000 |
| . | 1110 | 11 | 12 | 14 | 1 | 0 | 0 | 11111 | 00 | 0 | 000100 | 000000 | 000000 | 000 |
| 16 | 0111 | 12 | 12 | 14 | 1 | 0 | 0 | 10110 | 00 | 0 | 000100 | 000000 | 000000 | 000 |
| . | 1011 | 12 | 13 | 14 | 1 | 0 | 0 | 10110 | 00 | 0 | 000100 | 000010 | 000000 | 000 |
| . | 1101 | 13 | 13 | 14 | 1 | 0 | 0 | 10110 | 00 | 0 | 000110 | 000010 | 000000 | 000 |
| . | 1110 | 13 | 14 | 15 | 1 | 0 | 0 | 10110 | 00 | 0 | 000110 | 000010 | 000000 | 010 |
| 20 | 0111 | 14 | 14 | 15 | 1 | 1 | 0 | 00101 | 00 | 0 | 000110 | 000010 | 000010 | 010 |
| . | 1011 | 14 | 15 | 15 | 1 | 1 | 0 | 00101 | 00 | 0 | 000110 | 000011 | 000010 | 010 |
| . | 1101 | 15 | 15 | 15 | 1 | 1 | 0 | 00101 | 00 | 0 | 000111 | 000011 | 000010 | 010 |
| . | 1110 | 15 | 4 | 13 | 1 | 1 | 0 | 00101 | 00 | 0 | 000111 | 000011 | 000010 | 011 |
| 24 | 0111 | 4 | 4 | 13 | 1 | 0 | 1 | 00000 | 00 | 1 | 000111 | 000011 | 000010 | 011 |
| . | 1011 | 4 | 5 | 13 | 1 | 0 | 1 | 00000 | 00 | 1 | 000111 | 000011 | 000010 | 011 |
| . | 1101 | 5 | 5 | 13 | 1 | 0 | 1 | 00000 | 00 | 1 | 000111 | 000011 | 000010 | 011 |
| . | 1110 | 5 | 6 | 14 | 1 | 0 | 1 | 00000 | 00 | 1 | 000111 | 000011 | 000010 | 011 |
| 28 | 0111 | 6 | 6 | 14 | 1 | 0 | 0 | 01000 | 10 | 0 | 000111 | 000011 | 000010 | 011 |
| . | 1011 | 6 | 7 | 14 | 1 | 0 | 0 | 01000 | 10 | 0 | 000111 | 000011 | 000010 | 011 |
| . | 1101 | 7 | 7 | 14 | 1 | 0 | 0 | 01000 | 10 | 0 | 000111 | 000011 | 000010 | 011 |
| . | 1110 | 7 | 8 | 15 | 1 | 0 | 0 | 01000 | 10 | 0 | 000111 | 000011 | 000010 | 001 |
| 32 | 0111 | 8 | 8 | 15 | 1 | 1 | 0 | 11000 | 10 | 0 | 000111 | 000011 | 000010 | 001 |
| . | 1011 | 8 | 9 | 15 | 1 | 1 | 0 | 11000 | 10 | 0 | 000111 | 000011 | 000010 | 001 |
| . | 1101 | 9 | 9 | 15 | 1 | 1 | 0 | 11000 | 10 | 0 | 000111 | 000011 | 000010 | 001 |
| . | 1110 | 9 | 10 | 13 | 1 | 1 | 0 | 11000 | 10 | 0 | 000111 | 000011 | 000010 | 000 |
| 36 | 0111 | 10 | 10 | 13 | 1 | 0 | 0 | 11111 | 00 | 0 | 000111 | 000011 | 000010 | 000 |
| . | 1011 | 10 | 11 | 13 | 1 | 0 | 0 | 11111 | 00 | 0 | 000111 | 000111 | 000010 | 000 |
| . | 1101 | 11 | 11 | 13 | 1 | 0 | 0 | 11111 | 00 | 0 | 000111 | 000111 | 000010 | 000 |
| . | 1110 | 11 | 12 | 14 | 1 | 0 | 0 | 11111 | 00 | 0 | 000111 | 000111 | 000010 | 000 |
| 40 | 0111 | 12 | 12 | 14 | 1 | 0 | 0 | 10110 | 01 | 0 | 000111 | 000111 | 000010 | 000 |
| . | 1011 | 12 | 13 | 14 | 1 | 0 | 0 | 10110 | 01 | 0 | 000111 | 000101 | 000010 | 000 |
| . | 1101 | 13 | 13 | 14 | 1 | 0 | 0 | 10110 | 01 | 0 | 000111 | 000101 | 000010 | 000 |
| . | 1110 | 13 | 14 | 15 | 1 | 0 | 0 | 10110 | 01 | 0 | 000111 | 000101 | 000010 | 000 |
| 44 | 0111 | 14 | 14 | 15 | 1 | 1 | 0 | 00101 | 01 | 0 | 000111 | 000101 | 000000 | 000 |
| . | 1011 | 14 | 15 | 15 | 1 | 1 | 0 | 00101 | 01 | 0 | 000111 | 000100 | 000000 | 000 |
| . | 1101 | 15 | 15 | 15 | 1 | 1 | 0 | 00101 | 01 | 0 | 000111 | 000100 | 000000 | 000 |
| . | 1110 | 15 | 4 | 13 | 1 | 1 | 0 | 00101 | 01 | 0 | 000111 | 000100 | 000000 | 001 |
| 48 | 0111 | 4 | 4 | 13 | 1 | 0 | 0 | 00000 | 00 | 0 | 000111 | 000100 | 000001 | 001 |
| . | 1011 | 4 | 5 | 13 | 1 | 0 | 0 | 00000 | 00 | 0 | 000111 | 000100 | 000001 | 001 |
| . | 1101 | 5 | 5 | 13 | 1 | 0 | 0 | 00000 | 00 | 0 | 000111 | 000100 | 000001 | 001 |
| . | 1110 | 5 | 6 | 14 | 1 | 0 | 0 | 00000 | 00 | 0 | 000111 | 000100 | 000001 | 001 |
| 52 | 0111 | 6 | 6 | 14 | 1 | 0 | 0 | 00000 | 00 | 0 | 000111 | 000100 | 000001 | 001 |
| . | 1011 | 6 | 7 | 14 | 1 | 0 | 0 | 00000 | 00 | 0 | 000111 | 000100 | 000001 | 001 |
| . | 1101 | 7 | 7 | 14 | 1 | 0 | 0 | 00000 | 00 | 0 | 000111 | 000100 | 000001 | 001 |
| . | 1110 | 7 | 8 | 15 | 1 | 0 | 0 | 00000 | 00 | 0 | 000111 | 000100 | 000001 | 001 |
| 56 | 0111 | 8 | 8 | 15 | 1 | 1 | 1 | 00000 | 10 | 1 | 000111 | 000100 | 000001 | 001 |
| . | 1011 | 8 | 9 | 15 | 1 | 1 | 1 | 00000 | 10 | 1 | 000111 | 000100 | 000001 | 001 |
| . | 1101 | 9 | 9 | 15 | 1 | 1 | 1 | 00000 | 10 | 1 | 000111 | 000100 | 000001 | 001 |
| . | 1110 | 9 | 10 | 13 | 1 | 1 | 1 | 00000 | 10 | 1 | 000111 | 000100 | 000001 | 000 |
| 60 | 0111 | 10 | 10 | 13 | 1 | 0 | 0 | 00000 | 01 | 0 | 000111 | 000100 | 000001 | 000 |
| . | 1011 | 10 | 11 | 13 | 1 | 0 | 0 | 00000 | 01 | 0 | 000111 | 000100 | 000001 | 000 |
| . | 1101 | 11 | 11 | 13 | 1 | 0 | 0 | 00000 | 01 | 0 | 000111 | 000100 | 000001 | 000 |
| . | 1110 | 11 | 12 | 14 | 1 | 0 | 0 | 00000 | 01 | 0 | 000111 | 000100 | 000001 | 000 |

TABLE III: [42, 18] i = 2 over GF $[2^3]$ (contir  1)

```
t Clock      Counters    Control    Flipflops
                         + msg
    cccc                 s p d              o
    llll     A   B   X   h b i      YYZZZ YB u
    kkkk                 m   n      01012 LL t
    0123                 c   y              p
                             t              u
                                            t     ramA   ramB   ramA   ramX
                                                  even          odd 64  0111    12  12  14   1  0  0   00000 00 0    000011 000100 000101 000
 .  1011    12  13  14   1  0  0   00000 00 0    000011 000110 000101 000
 .  1101    13  13  14   1  0  0   00000 00 0    000001 000110 000101 000
 .  1110    13  14  15   1  0  0   00000 00 0    000001 000110 000101 000
68  0111    14  14  15   1  1  0   00000 00 0    000001 000110 000101 000
 .  1011    14  15  15   1  1  0   00000 00 0    000001 000111 000101 000
 .  1101    15  15  15   1  1  0   00000 00 0    000000 000111 000101 000
 .  1110    15   4  13   1  1  0   00000 00 0    000000 000111 000101 001

72  0111     4   4  13   0  0  0   00000 00 0    000000 000111 000100 001
 .  1011     4   5  13   0  0  0   00000 00 0    000000 000111 000100 001
 .  1101     5   5  13   0  0  0   00000 00 0    000000 000111 000100 001
 .  1110     5   6  14   0  0  0   00000 00 0    000000 000111 000100 001
76  0111     5   6  14   0  0  0   00000 00 0    000000 000111 000100 001
 .  1011     6   7  14   0  0  0   00000 00 0    000000 000111 000100 001
 .  1101     7   7  14   0  0  0   00000 00 0    000000 000111 000100 001
 .  1110     7   8  15   0  0  0   00000 00 0    000000 000111 000100 001
80  0111     8   8  15   0  1  0   00000 10 1    000000 000111 000100 001
 .  1011     8   9  15   0  1  0   00000 10 1    000000 000111 000100 001
 .  1101     9   9  15   0  1  0   00000 10 1    000000 000111 000100 001
 .  1110     9  10  13   0  1  0   00000 10 1    000000 000111 000100 000
84  0111    10  10  13   0  0  0   00000 01 0    000000 000011 000100 000
 .  1011    10  11  13   0  0  0   00000 01 0    000000 000011 000100 000
 .  1101    11  11  13   0  0  0   00000 01 0    000000 000011 000100 000
 .  1110    11  12  14   0  0  0   00000 01 0    000000 000011 000100 100
88  0111    12  12  14   0  0  0   00000 01 0    000000 000011 000100 100
 .  1011    12  13  14   0  0  0   00000 01 0    000000 000001 000100 100
 .  1101    13  13  14   0  0  0   00000 01 0    000000 000001 000100 100
 .  1110    13  14  15   0  0  0   00000 01 0    000000 000001 000100 100
92  0111    14  14  15   0  1  0   00000 01 0    000000 000001 000110 100
 .  1011    14  15  15   0  1  0   00000 01 0    000000 000000 000110 100
 .  1101    15  15  15   0  1  0   00000 01 0    000000 000000 000110 100
 .  1110    15   4  13   0  1  0   00000 01 0    000000 000000 000110 100

96  0111     4   4  13   0  0  0   00000 10 1    000000 000000 000111 100
 .  1011     4   5  13   0  0  0   00000 10 1    000000 000000 000111 100
 .  1101     5   5  13   0  0  0   00000 10 1    000000 000000 000111 100
 .  1110     5   6  14   0  0  0   00000 10 1    000000 000000 000111 000
100 0111     6   6  14   0  0  0   00000 00 0    000000 000000 000111 000
 .  1011     6   7  14   0  0  0   00000 00 0    000000 000000 000111 000
 .  1101     7   7  14   0  0  0   00000 00 0    000000 000000 000111 000
 .  1110     7   8  15   0  0  0   00000 00 0    000000 000000 000111 000
 4  0111     8   8  15   0  1  0   00000 00 0    000000 000000 000111 000
 .  1011     8   9  15   0  1  0   00000 00 0    000000 000000 000111 000
 .  1101     9   9  15   0  1  0   00000 00 0    000000 000000 000111 000
 .  1110     9  10  13   0  1  0   00000 00 0    000000 000000 000111 000
 8  0111    10  10  13   0  0  0   00000 00 0    000000 000000 000111 000
 .  1011    10  11  13   0  0  0   00000 00 0    000000 000000 000111 000
 .  1101    11  11  13   0  0  0   00000 00 0    000000 000000 000111 000
 .  1110    11  12  14   0  0  0   00000 00 0    000000 000000 000111 100
12  0111    12  12  14   0  0  0   00000 00 0    000000 000000 000011 100
 .  1011    12  13  14   0  0  0   00000 00 0    000000 000000 000011 100
 .  1101    13  13  14   0  0  0   00000 00 0    000000 000000 000011 100
 .  1110    13  14  15   0  0  0   00000 00 0    000000 000000 000011 100
16  0111    14  14  15   0  1  0   00000 00 0    000000 000000 000011 110
 .  1011    14  15  15   0  1  0   00000 00 0    000000 000000 000001 110
 .  1101    15  15  15   0  1  0   00000 00 0    000000 000000 000001 110
 .  1110    15   4  13   0  1  0   00000 00 0    000000 000000 000001 111

20  0111     4   4  13   0  0  0   00000 10 1    000000 000000 000000 111
 .  1011     4   5  13   0  0  0   00000 10 1    000000 000000 000000 111
 .  1101     5   5  13   0  0  0   00000 10 1    000000 000000 000000 111
 .  1110     5   6  14   0  0  0   00000 10 1    000000 000000 000000 011
24  0111     6   6  14   0  0  0   00000 10 1    000000 000000 000000 011
 .  1011     6   7  14   0  0  0   00000 10 1    000000 000000 000000 011
 .  1101     7   7  14   0  0  0   00000 10 1    000000 000000 000000 011
 .  1110     7   8  15   0  0  0   00000 10 1    000000 000000 000000 001
28  0111     8   8  15   0  1  0   00000 10 1    000000 000000 000000 001
 .  1011     8   9  15   0  1  0   00000 10 1    000000 000000 000000 001
 .  1101     9   9  15   0  1  0   00000 10 1    000000 000000 000000 001
 .  1110     9  10  13   0  1  0   00000 10 1    000000 000000 000000 000
32  0111    10  10  13   0  0  0   00000 00 0    000000 000000 000000 000
 .  1011    10  11  13   0  0  0   00000 00 0    000000 000000 000000 000
 .  1101    11  11  13   0  0  0   00000 00 0    000000 000000 000000 000
 .  1110    11  12  14   0  0  0   00000 00 0    000000 000000 000000 000
36  0111    12  12  14   0  0  0   00000 00 0    000000 000000 000000 000
 .  1011    12  13  14   0  0  0   00000 00 0    000000 000000 000000 000
 .  1101    13  13  14   0  0  0   00000 00 0    000000 000000 000000 000
 .  1110    13  14  15   0  0  0   00000 00 0    000000 000000 000000 000
40  0111    14  14  15   0  1  0   00000 00 0    000000 000000 000000 000
 .  1011    14  15  15   0  1  0   00000 00 0    000000 000000 000000 000
 .  1101    15  15  15   0  1  0   00000 00 0    000000 000000 000000 000
 .  1110    15   4  13   0  1  0   00000 00 0    000000 000000 000000 000
```

TABLE III (continued)

```
t Clock    Counters    Control   Flipflops      o
                        + msg                   u
     cccc   A   B   X        h d   YYZZZ  xB    t
     llll                 s  b 1   01012  LL    p
     kkkk                 m  y n                u
     0123                 c  t                  t       ramA      ramB     ramA     ramX
                                                        even               odd 44   0111   4   4  13    0  0 0   00000   00  0       000000   000000   000000   000
  .  1011   4   5  13    0  0 0   00000   00  0       000000   000000   000000   000
  .  1101   5   5  13    0  0 0   00000   00  0       000000   000000   000000   000
  .  1110   5   6  14    0  0 0   00000   00  0       000000   000000   000000   000
48   0111   6   6  14    0  0 0   00000   00  0       000000   000000   000000   000
  .  1011   6   7  14    0  0 0   00000   00  0       000000   000000   000000   000
  .  1101   7   7  14    0  0 0   00000   00  0       000000   000000   000000   000
  .  1110   7   8  15    0  0 0   00000   00  0       000000   000000   000000   000
52   0111   8   8  15    0  1 0   00000   00  0       000000   000000   000000   000
  .  1011   8   9  15    0  1 0   00000   00  0       000000   000000   000000   000
  .  1101   9   9  15    0  1 0   00000   00  0       000000   000000   000000   000
  .  1110   9  10  13    0  1 0   00000   00  0       000000   000000   000000   000
56   0111  10  10  13    0  0 0   00000   00  0       000000   000000   000000   000
  .  1011  10  11  13    0  0 0   00000   00  0       000000   000000   000000   000
  .  1101  11  11  13    0  0 0   00000   00  0       000000   000000   000000   000
  .  1110  11  12  14    0  0 0   00000   00  0       000000   000000   000000   000
62   0111  12  12  14    0  0 0   00000   00  0       000000   000000   000000   000
  .  1011  12  13  14    0  0 0   00000   00  0       000000   000000   000000   000
  .  1101  13  13  14    0  0 0   00000   00  0       000000   000000   000000   000
  .  1110  13  14  15    0  0 0   00000   00  0       000000   000000   000000   000
66   0111  14  14  15    0  1 0   00000   00  0       000000   000000   000000   000
  .  1011  14  15  15    0  1 0   00000   00  0       000000   000000   000000   000
  .  1101  15  15  15    0  1 0   00000   00  0       000000   000000   000000   000
  .  1110  15   4  13    0  1 0   00000   00  0       000000   000000   000000   000
```

TABLE IV

History of the First Bit

| t | Action | Comment |
|---|--------|---------|
| 3 | $D_{in} + XL \rightarrow Y1$ | |
| 7 | $Y1 \rightarrow Y0$ | |
| 11 | $Y0 \rightarrow Z0$ | Y2 on wire |
| 13 | $Z0 \rightarrow A(10)$ | A(10) is $A_i^+$ |
| 36 | $A(10) + T_1 \rightarrow B(10)$ | first sum in $B_i$ |
| 59 | $B(10) \rightarrow BL$ | prepare to re-enter RAM A after taking sum |
| 63 | $BL + T_2 \rightarrow A(11)$ | |
| 86 | $A(11) + T_1 \rightarrow X(13)$ | A(11) is $A_i^-$ |
| 95 | $X(13) \rightarrow XL$ | first check bit |

A better understanding of the propagation of bits through the encoder can be gained with the aid of Table IV which traces the significant events in the history of the first message bit from t=0 to t=95, at which time it is presented at XL where it is then available for gating to the channel at T=96.

The bit BL is also tabulated because it is an alternative input to the A RAM: when RAM A assumes the role of $A^-$, it derives its input from $BL+T_2$; when RAM A assumes the role of $A^+$ its input is obtained from $Z_0$ (or more precisely, the product $1 \times Z_0$) which may be identified with the quantity $T_0$.

Figure 3:
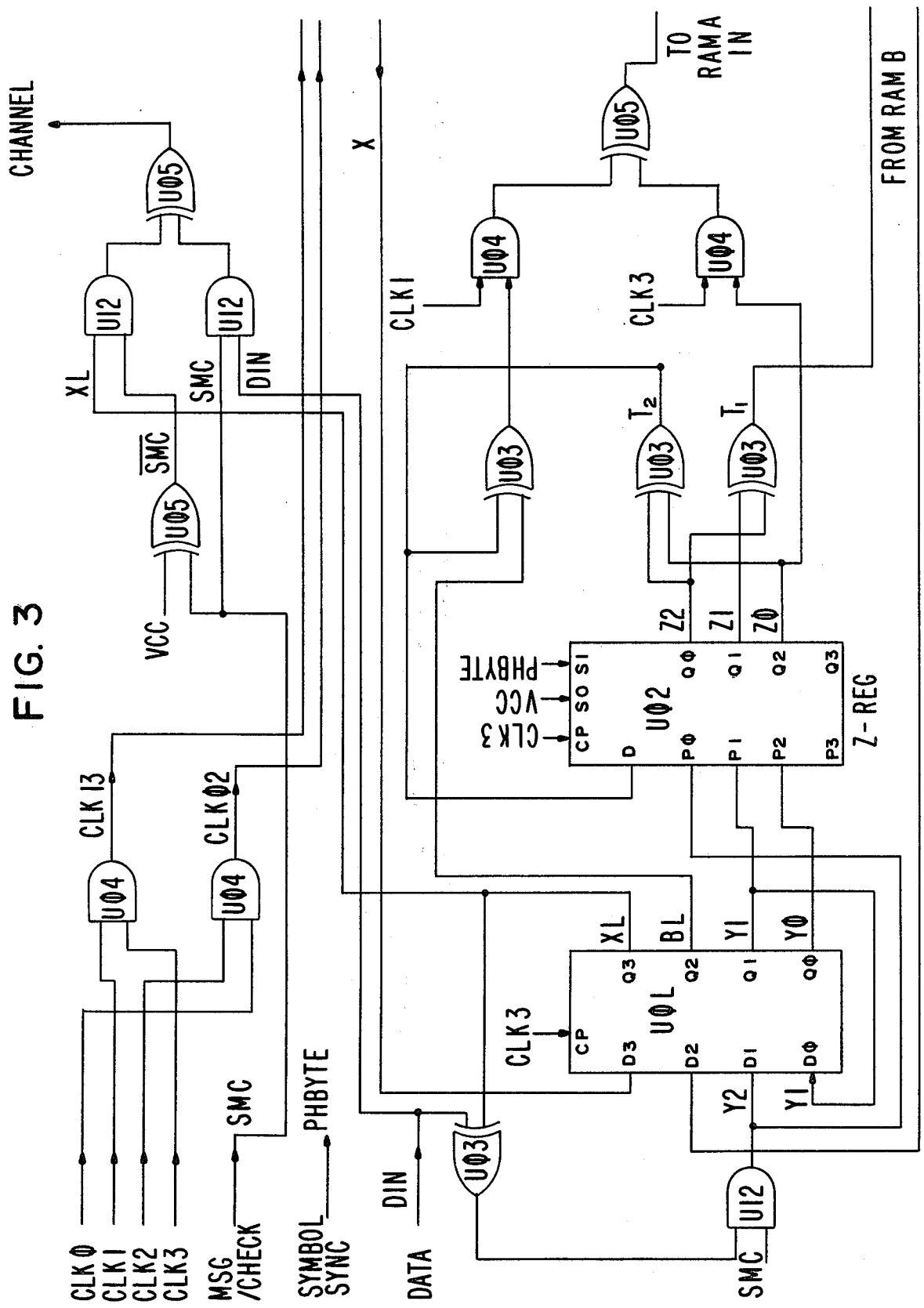
FIGS. 3A and 3B show a circuit implementation of the apparatus of FIG. 1 with FIG. 2B.
Figure 3A:
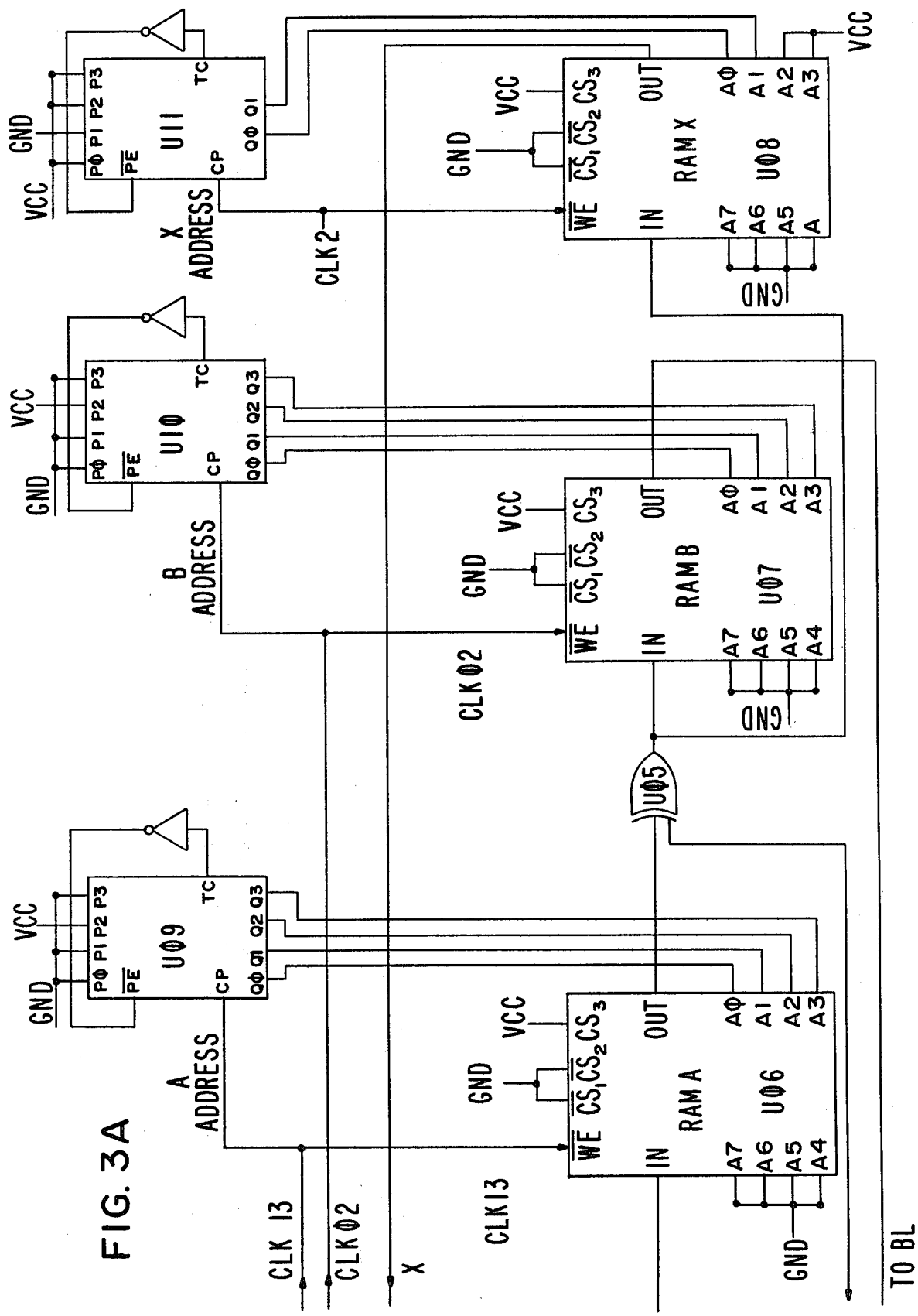

The model encoder of the above discussion is shown in detail in FIGS. 3A and 3B as realized from commercially available components. The operation of the model encoder is straightforward, when considered in conjunction with Table III and FIG. 1. It is useful to note that the signal PHBYT becomes high as the third bit of the message symbol becomes available at the input to the Y register and at the transition of PHBYT to low, the Z register is strobed to accept $Y_0$ and $Y_1$, stored in their respective flip flops, and $Y_2$ which is available as the sum of the input wire and the bit fed out of the feedback shift register.

The organization of bits in the shift register of the present invention is particularly useful in respect of the desired interleaving capability of the encoder. The model encoder accommodates an interleaving depth of 2. Given an input data block comprising the interleaved code symbols $M_1 N_1 M_2 N_2 M_3 N_3$, the check bits developed from the message bits of the M subcode are independent of the check bits developed from the N subcode. The feedback shift register of the present invention is so organized to present bits corresponding to the same parent subcode to its corresponding summing junctions whenever the Z register contains bits pertinent to that symbol. Bits pertinent to other symbols are thus buried within the shift register.

Figure 4:
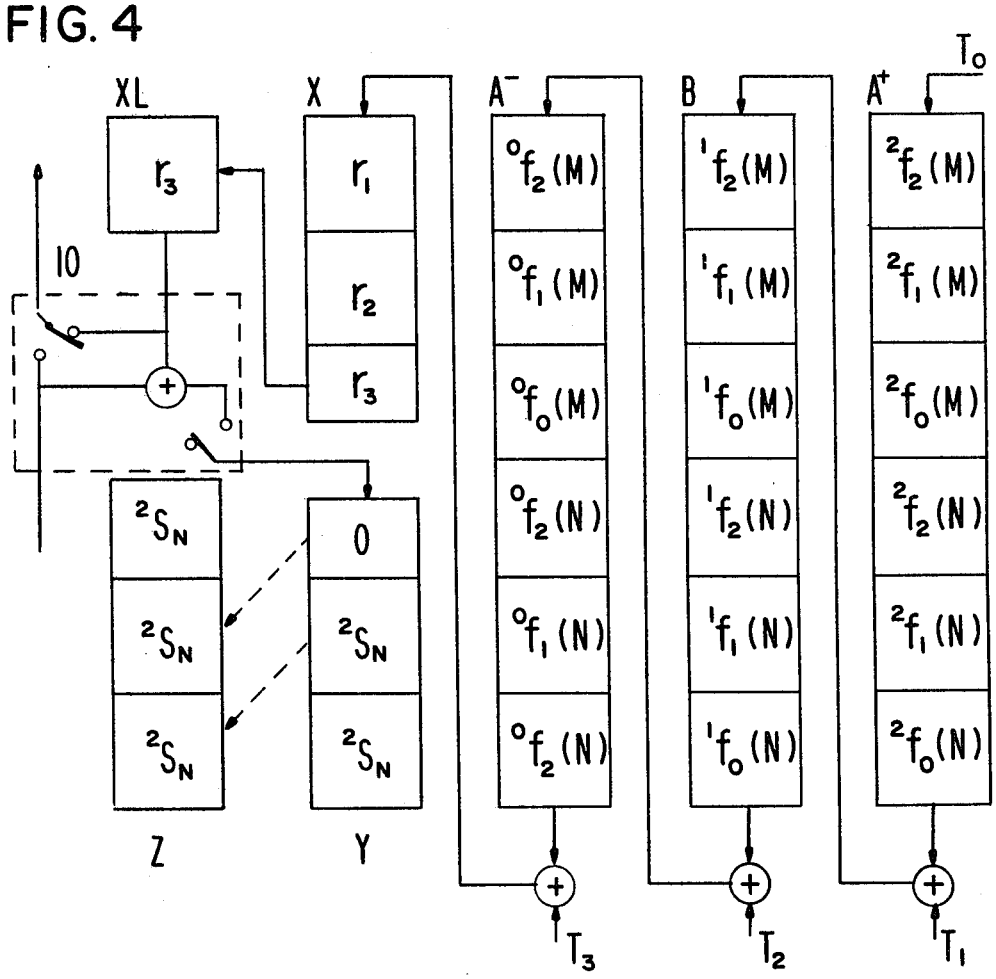
FIG. 4 shows the organization of information within the model feedback shift register at a particular time.

These observations are illustrated with the aid of FIG. 4 which shows the content of the major registers of the model encoder at a time shortly after the transition SMC=1→0. At this time the last message bit of the last message character of the second interleaved subcode has been transmitted to the information channel through the multiplexor 10. The computations in the encoder proper will soon be complete. Binary functions of the interleaved subcode message characters $M_0$ $N_0$ $M_1$ $N_1$ $M_2$ $N_2$ are present in the encoder such that only functions pertaining to the characters of one subcode, N for example, are presented to the summing junctions concurrently with the presence in the Z register of another function of the bits. At the selected time, functions of the last message character $N_3$ remain in the course of processing in the Z register. The shift registers therefore contain M-functions derived from all of the M subcode characters just as the N-functions are developed from all of the N subcode characters. At this selected time, the X-register contains the first three check bits and also the first check bit has been transferred to XL from where it will be directed to the channel. During the following cycles of operation, the N and M functions will evolve into further check bits for the respective subcodes.

Inasmuch as computation is virtually completed at the time illustrated in FIG. III one can observe that shortly thereafter, the component shift registers $A^+$, B, A and X will contain the remaining check bits of the codeword. One notes that during this period of time (SMC=0) the Y register will fill with 0s and gradually the component shift registers $A^+$, B, $A^-$, and X of the feedback shift register will also fill with 0s. In the meantime, the $T_i$ computed from Y by way of Z will yield 0s for application to the summing junctions. Thus, the shift register content will be unaffected.

The model encoder has interleaving capability to depth 2. In order to accommodate effectively independent interleaved subcodes, the length of each component shift register $A^+$ and $A^-$ is given by the product of (number of bits/symbol)×(interleaving depth). For the present example model encoder, the component shift registers have a length of six bits and the RAM in which $A^+$ and $A^-$ reside is therefore addressed by a Mod 12 counter. The six bit shift register B is implemented by itself in RAM B. Addressing for the B shift register can be satisfied from either a full-speed Mod 12 counter or from a half-speed Mod 6 counter. In the former case every other location of the B RAM will be blank. Register X is shortened by the character size, here three bits, and is addressed from a Mod 3 counter.

Figure 5:
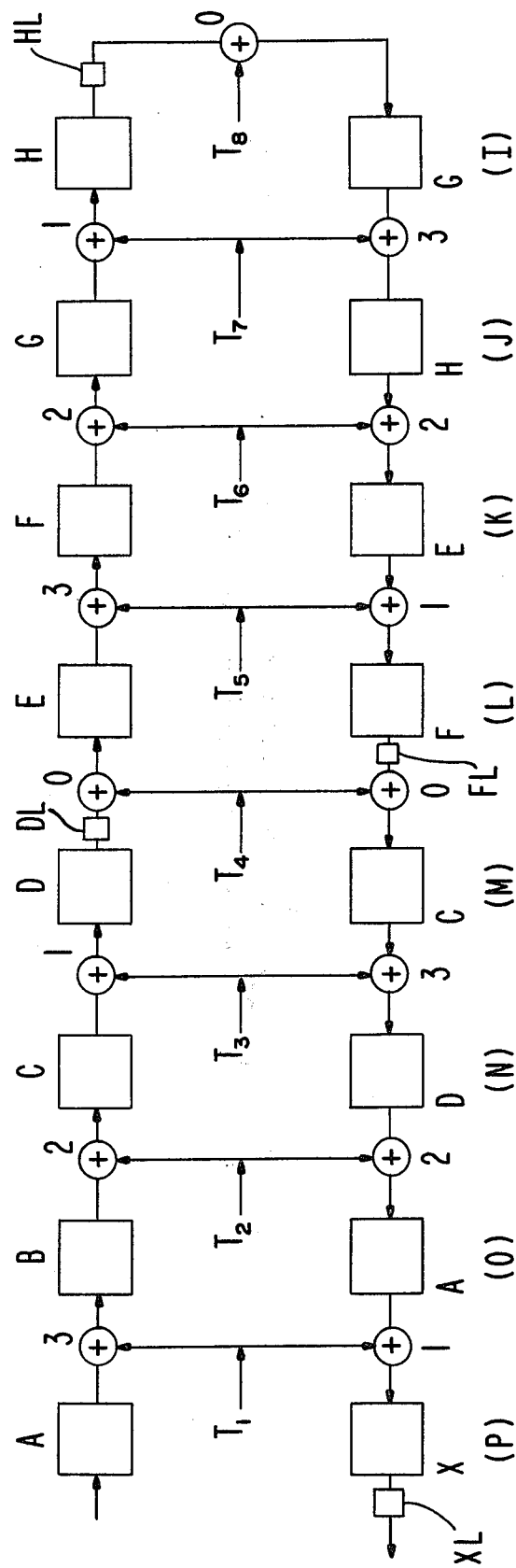
FIG. 5 shows the feedback shift register of FIG. 1 for a code over $GF(2^8)$.

Application of the present invention to larger RS codes is for the most part an extension of the principles described in the structure of the four stage model encoder above. Turning now to FIG. 5, there is shown a symmetrized feedback shift register for the RS (255,239) code over $GF(2^8)$ for interleaving depths up to 16. As with the 4 stage model encoder, it is here possible to implement several shift registers in a common RAM chip and to reduce the number of adders forming the interstage summing junctions of the resulting feedback shift register. Each of the lettered boxes A through P is a component shift register of length equal to the product of the interleaving depth and the number of bits comprising a code symbol. The lettered shift registers are shown with alternate labeling on the bottom row to suggest a particular pairing. The adders forming the interstage summing junctions are labeled 0, 1, 2 and 3 according to the rules that the 4 adders at inputs and outputs of both commonly labeled component shift registers have different numbers; and further that the adder directed to the input of any component shift register is one more (mod 4) than the adder receiving the output thereof. From these properties there follows the time sharing of adders and component shift registers as further described.

As with the model encoder, a 4 phase clock controls the time sharing. If the component shift registers labeled A, C, E, and G write on phases 0 and 2 and read on phases 1 and 3, the 8 corresponding shift registers (top and bottom rows) can be implemented within a single 256×4 RAM chip. These component shift registers, labeled $A^+$, $C^+$, $E^+$ and $G^+$ corresponding to the top row, will be serviced at one address and the other four component shift registers $A^-$, $C^-$, $E^-$ and $G^-$ at a successive address. It is convenient to employ the same RAM address for each of the set of component shift registers $A^+$, $C^+$, $E^+$ and $G^+$ and similarly employ a different common address for $A^-$, $C^-$, $E^-$ and $G^-$. The address transitions occur between phases 0 and 1 and between phases 2 and 3 as in the timing scheme of FIG. 2C.

The remaining paired component shift registers B, D, F and H write on phases 1 and 3, read on phases 0 and 2 and respond to address transitions between phases 1 and 2 and again between phases 3 and 0. Thus, B, D, F and H may occupy a second 256×4 RAM chip. Each of the two RAM chips is addressed by a different independent counter because the addresses increment at different phases. These counters will be mod 128 because each component shift register must accommodate 8 bits/code character, an interleaving index of 8 and must provide 2 addresses per input bit.

As in the case of the model encoder, the X stage, or final stage is shortened with respect to the others by one full character and requires a separate RAM and separate addressing. The X stage is reduced in the present instance by 8 bits (the message symbol length) and can be addressed by a mod 56 counter if it is clocked once per input bit or a mod 112 counter if it is clocked in phase with its phase mates B, D, F and H. Either clocking is acceptable.

The inclusion of additional interstage bits DL, FL, HL have a clear antecedent in BL and XL bits of the model encoder of FIG. 3A and 3B. In the feedback shift register of FIG. 5 these flip flops precede the 0 numbered adders and are the data sources at phase 0 for the stages E, $G^-$ and $C^-$. Essentially the same function is served by the wired input at register $A^+$. These flip-flops provide the extra temporary storage cells needed to move the data forward during the several clock phases which occur during a single bit-input time interval.

The time sharing of the interstage XOR gates is apparent with the aid of FIG. 5 where the adder numbering is observed to produce two major classes of adder ($T_8$+HL is a special case): in the first class, adders driven by a common $T_i$ have the same numbers. These adders are physically disposed between different pairs of component shift registers and must be physically distinct because of their separate but concurrent functions. The second class is composed of adders driven from a common input characterized by different numbers in the top and bottom row. These adders are also observed to be disposed between the same pair of shift registers. In this class are $G+T_7$; $E+T_5$; $C+T_3$; and $A+T_1$. Consequently, these four adders serve at different times to operate as interstage adders for 8 different summing junctions.

The encoder of the present invention is not limited to codes realized from symmetric generator polynomials. It has been demonstrated that this feature results in simplification of the apparatus and reduction in the required components. Moreover, the feedback shift register implementation and structure of the present invention is also not a limitation. Conventional shift register structures can be employed to implement the invention. Furthermore the time sharing of components of a feedback shift register is not a limitation on the present invention. These results, which could be applied to bit-parallel encoders, are independent of each other and the structure implementing bit serial multiplicative encoding in the dual basis.

A pure bit serial encoding structure has advantageous properties apart from the opportunities presented for economically utilizing components by time-sharing strategies or through the reduction of the number of coefficients by choice of a symmetrical generator polynomial. Any code creating r redundancy bits will require nearly r bits memory. For the most part, this memory is to be found in the feedback shift register for the encoder regardless of the specific design thereof. In current practice, size of memory is no longer a major economic limitation. A better measure of complexity is the number of integrated circuit pins (taken roughly as the number of ICs in the encoder divided by some average number of useful inputs per IC) needed to create, manipulate, and retrieve a large number of redundancy bits. Both bit parallel or bit serial encoders receive the benefit of an interleaving depth d in the reduction of the number of pins required by a factor 1/d. A bit serial encoder propagates m bits over the same pin and therefore achieves a further reduction in pin requirement for an additional factor 1/m.

Express application to RS codes is clearly not a limitation to the present invention. Cyclic codes in general can be treated by extension of the principles herein described. Moreover, while the present invention has been described in the context of an encoder, one of average skill in the art will recognize that such apparatus is applicable in error correcting decoders for syndrome generation and like functions.

Apparatus has been set forth as a practical example of the result of practicing the methods herein taught. It will be obvious to those skilled in the art that various changes apart from the examples suggested may be made in the embodiment disclosed, without departing from the invention.

I claim:

1. Encoding apparatus for accepting a message block comprising message symbols comprising groups of bits, creating from said message symbols codewords and check bits derived from said message symbols in accord with a cyclic code for output to an information channel, said apparatus comprising
    (a) first codeword shift register for assembling bits of of an input message symbol received from a data source, said message symbol represented in a first representation in the form of an ordered set of coefficients of corresponding powers of an element of the finite field $GF(2^m)$,
    (b) second shift register for receiving said assembled message symbol by parallel transfer from said first codeword shift register,
    (c) binary matrix network means for generating from the content of the respective bits of said second shift register, the traces of the respective matrix products of the content of said second shift register and the bits of a selected generator polynomial, said matrix representing a coefficient of a product of said generator polynomial and the content of said second shift register in the dual representation of said first representation,
    (d) feedback shift register means for processing each said product of a coefficient, comprising an initial memory element, a final memory element and a plurality of sequences of memory elements, each said sequence separated by summing junctions, each said summing junction comprising means for performing the binary addition of the content of one adjacent memory element with the respective said trace of said matrix product and transferring the resulting sum to the next adjacent memory element, the initial memory element receiving the trace of the lowest order of said matrix products, the final memory element of said shift register communicating with said binary network means during the acceptance of said message block and thereafter emitting check bits for transmission to said information channel as part of said codeword,
    (e) synchronization means for controlling the assembly of a message character in said first shift register, strobing the content of said first shift register in parallel to said second shift register and to control the propagation of information through said feedback shift register.

2. The encoder of claim 1 wherein the coefficients of said selected generator polynomial comprises a pallindrone.

3. The encoder of claim 1 or 2 wherein said feedback shift register comprises at least three random access memory arrays, each said memory array comprising a plurality of ordered memory elements, adjacent said memory elements comprising respective first and second said memory arrays and said final memory element comprising a third said memory array.

4. The feedback shift register means of claim 1 comprising means for interleaving successive coefficients in said feedback shift register means in accord with a selected interleaving index.

5. The feedback shift register of claim 3 comprising addressing means for indexing said memory elements in each said arrays to accommodate at least two said sequences of memory elements in any of said arrays and a selected interleaving depth for the content of said arrays.

6. A feedback shift register for serially propagating and algebraically operating on a stream of bits, said bits comprising a stream of characters, said feedback shift register comprising a plurality of stages, each said stage having a capacity for a first plurality of bits, said feedback shift register comprising at least two random access memory arrays, adjacent stages of said feedback shift register comprising respective first and second said random access memory arrays, a plurality of adder means, each said adder means electrically arranged between each adjacent said pair of shift register stages for computing the sum of the content of the kth stage of said feedback shift register with an algebraic quantity and supplying said sum to the k+1 stage, first and second addressing means for addressing respective said memory arrays, clock means comprising means for generating at least 4 distinguishable pulses, means responsive to each successive said clock pulse for initiating the respective operations of writing and reading between adjacent stages whereby communication between memory arrays is facilitated for the plurality of stages contained in each said array.

7. The feedback shift register of claim 6 further comprising a final stage, said final stage having a capacity less than said first plurality of bits by a second plurality of bits comprising at least one character.

8. The feedback shift register of claim 7 comprising an initial stage and combinatorial means for introducing a function of the content of said final stage to said initial stage.

9. The method of generating check bits from an input message word represented in a basis wherein symbols comprising said message word are represented as coefficients of a polynomial in powers of an element of a finite field comprising
   (a) transforming the coefficients of said first representation basis of said message word to a second basis, said second basis dual to said first basis,
   (b) performing the serial multiplication of said dual basis represented message word with a selected generator polynomial to obtain said check bits,
   (c) appending said check bits to said message word.

10. The method of claim 9 comprising selecting a generator polynomial in the dual basis wherein the coefficients of said generator polynomial form a pallindrone.

11. Apparatus for obtaining the product of a variable, said variable represented in a first basis as a set of m coefficients of a polynomial in successive powers of an element of the finite field GF ($2^m$), with an ordered set of $n \leq m$ coefficients of a constant polynomial, said apparatus comprising
   (a) first means for receiving said variable from a data source,
   (b) a plurality of means for combining each of a corresponding plurality of selected subsets of said first set of m coefficients to obtain therefrom bits comprising the product of said variable with a single coefficient of said constant polynomial,
   (c) shift register means for receiving said product bits of said single coefficient,
   (d) transformation means for performing $m-1$ successive linear transformations of the content of said first register means, said first register means retaining the transformed quantity as a result thereof,
   (e) means for causing the occurrence of said transformation at $m-1$ succeeding intervals and shifting the content of said shift register for the assembly of said product in a portion of said shift register.

12. The apparatus of claim 11 wherein said combining means comprises means for computing a single parity check on said selected subset of the binary coefficients of said variable.

13. The apparatus of claim 12 wherein each said plurality of combining means comprises a gating network.

14. The apparatus of claim 13 wherein each said gating means comprises an XOR gate.

15. The apparatus of claim 12 wherein said first register means is a shift register and the actuation of said transformation means causes the content of said shift register to be multiplied, modulo m, by a selected element of said finite field.

16. The apparatus of claim 15 wherein said plurality of combining means is structured to represent said product coefficients in a second basis, said second basis the dual of said first basis.

17. The apparatus of claim 11 or 16 wherein the coefficients of said ordered set are invariant with respect to the inverse ordering thereof.

* * * * *

Disclaimer and Dedication

4,410,989.—*Elwyn R. Berlekamp*, Berkeley, Calif. BIT SERIAL ENCODER. Patent dated Oct. 18, 1983. Disclaimer and Dedication filed Dec. 22, 1989, by the assignee, Cyclotomics, Inc.

Hereby disclaims and dedicates to the Public all claims of said patent.
*[Official Gazette April 10, 1990 ]*